(12) United States Patent
Markson et al.

(10) Patent No.: US 6,246,367 B1
(45) Date of Patent: Jun. 12, 2001

(54) LIGHTNING LOCATING SYSTEM

(75) Inventors: Ralph J. Markson, Weston, MA (US); Lothar H. Ruhnke, Reston, VA (US)

(73) Assignee: Airborne Research Associates, Inc., Weston, MA (US)

( * ) Notice: Subject to any disclaimer, the term of this patent is extended or adjusted under 35 U.S.C. 154(b) by 0 days.

(21) Appl. No.: 09/102,452

(22) Filed: Jun. 22, 1998

Related U.S. Application Data

(63) Continuation of application No. 08/687,751, filed on Jul. 25, 1996, now Pat. No. 5,771,020
(60) Provisional application No. 60/001,540, filed on Jul. 26, 1995.

(51) Int. Cl.$^7$ ....................................... G01S 3/02
(52) U.S. Cl. ...................... 342/460; 324/72; 73/170.24
(58) Field of Search ........................ 342/460; 324/72; 73/170.24

(56) References Cited

U.S. PATENT DOCUMENTS

| | | | |
|---|---|---|---|
| 4,198,599 | 4/1980 | Krider et al. | 324/72 |
| 4,543,580 | 9/1985 | Bent et al. | 343/460 |
| 4,672,305 | 6/1987 | Coleman | 324/72 |
| 4,792,806 | 12/1988 | Bent et al. | 342/465 |
| 4,801,942 | 1/1989 | Markson et al. | 342/460 |
| 4,806,851 | 2/1989 | Krider et al. | 324/72 |
| 4,812,852 | 3/1989 | Bent et al. | 342/457 |
| 4,841,304 | 6/1989 | Richard et al. | 342/460 |
| 4,914,444 | 4/1990 | Pifer et al. | 342/460 |
| 4,916,455 | 4/1990 | Bent et al. | 342/457 |
| 4,950,978 | 8/1990 | Govaert | 324/72 |
| 4,972,195 | 11/1990 | Markson et al. | 342/460 |
| 4,996,473 | 2/1991 | Markson et al. | 324/72 |
| 5,057,820 | 10/1991 | Markson et al. | 340/600 |
| 5,331,330 | 7/1994 | Susnjara | 342/460 |
| 5,396,220 | 3/1995 | Markson et al. | 340/600 |
| 5,469,169 | 11/1995 | Frush | 342/26 |
| 5,508,619 | 4/1996 | Ozawa et al. | 324/535 |
| 5,539,409 | 7/1996 | Mathews et al. | 342/26 |
| B1 4,792,806 | 1/1993 | Bent et al. | 342/465 |

OTHER PUBLICATIONS

"Lightning Mapping System," C. Lennon, et al., 1991 International Aerospace and Ground Conference on Lightning and Electricity, Cocoa Beach, FL. Apr. 16–19, 1996, NASA Conf. Pub. 10058, paper No. 89, pp. 1–10.

"LPATS Lightning Waveforms—Waveforms Captured by the Swiss Network LPATS lightning receivers at 5 different locations," Atmospheric Research Systems, Inc., 2350 Commerce Park Dr. NE, Suite 3, Palm Bay, FL 32905, Apr. 1991, six pages.

(List continued on next page.)

*Primary Examiner*—Theodore M. Blum
(74) *Attorney, Agent, or Firm*—Testa, Hurwitz & Thibeault, LLP

(57) ABSTRACT

A lightning detection system for detecting and locating an initial discharge of an initial leader stroke of a lightning flash. An initial lightning discharge produces a pulse that can be used to accurately detect lightning, and more particularly, the location of the initial lightning discharge. In one embodiment, at least three sensors detect and determine the location of the first pulses from initial lightning discharges using time difference of arrival information of the pulses at each of the three sensors. In another embodiment, a single sensor is used to determine the range of an initial lightning discharge from the amplitude of a corresponding initial detected pulse, and to determine the direction from a crossed loop antenna An alternative embodiment of a single sensor system determines a distance of a lightning event from a peak amplitude value derived from a pulse amplitude distribution. In a further embodiment, a lightning detection system provides enhanced lightning location by incorporating weather data from a weather radar with detected lightning information.

16 Claims, 15 Drawing Sheets

OTHER PUBLICATIONS

"VHF Radio Pictures of Cloud Flashes," D.E. Proctor, Journal of Geophysical Research, vol. 86, No. C5, pp. 4041 and 4045, May 20, 1981.

"Accurate National Lightning Information—LPATS National Network ($LN^2$)," Atmospheric Research Systems, Inc., 2350 Commerce Park Dr. NE, Suite 3, Palm Bay, FL 32905, two pages, undated.

"A Microsecond-Synchronized Multipoint Slow Antenna System," Tomoo Ushio et al., Department of Electrical Engineering, Osaka University, Osaka, Japan, abstract, undated, two pages.

"Lightning Position and Tracking System (LPATS)," Atmospheric Research Systems, Inc., 230 Commerce Park Dr. NE, Suite 3, Palm Bay, FL 32905, fourteen pages, undated.

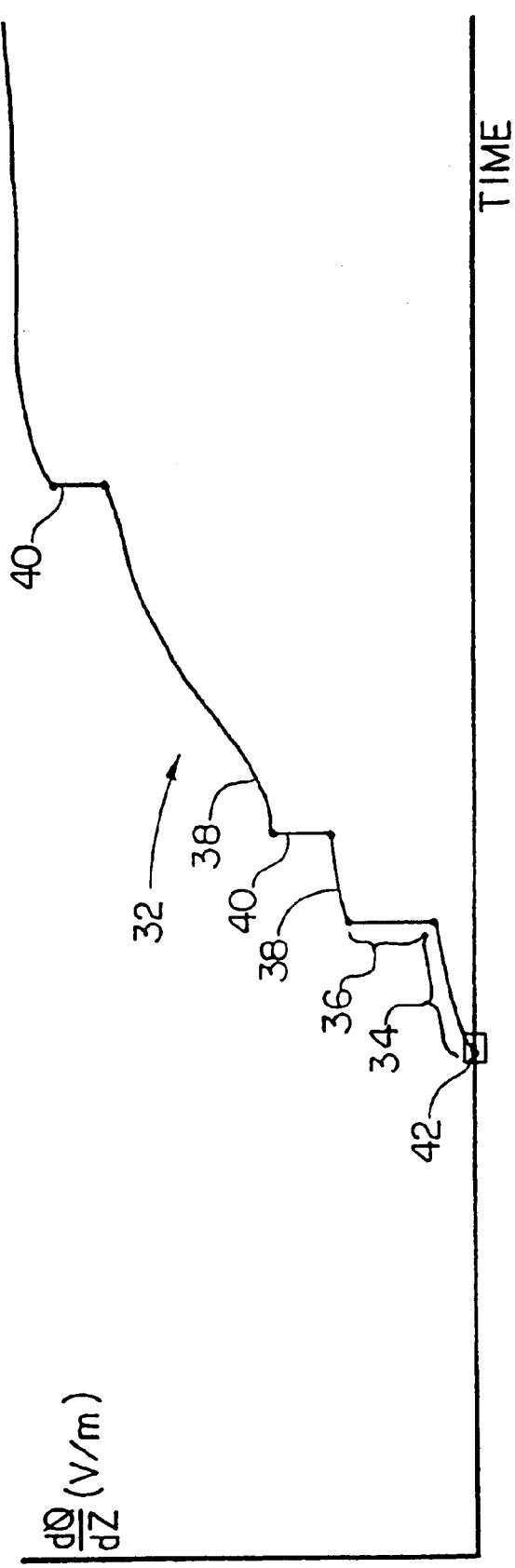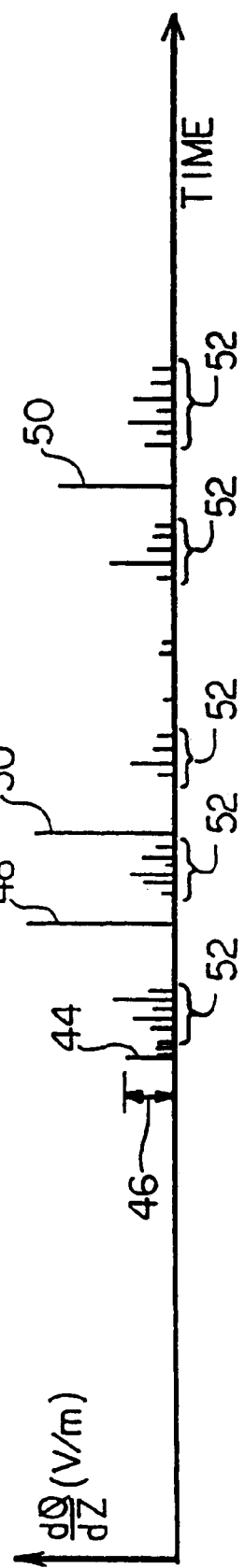
FIG. 2
FIG. 3

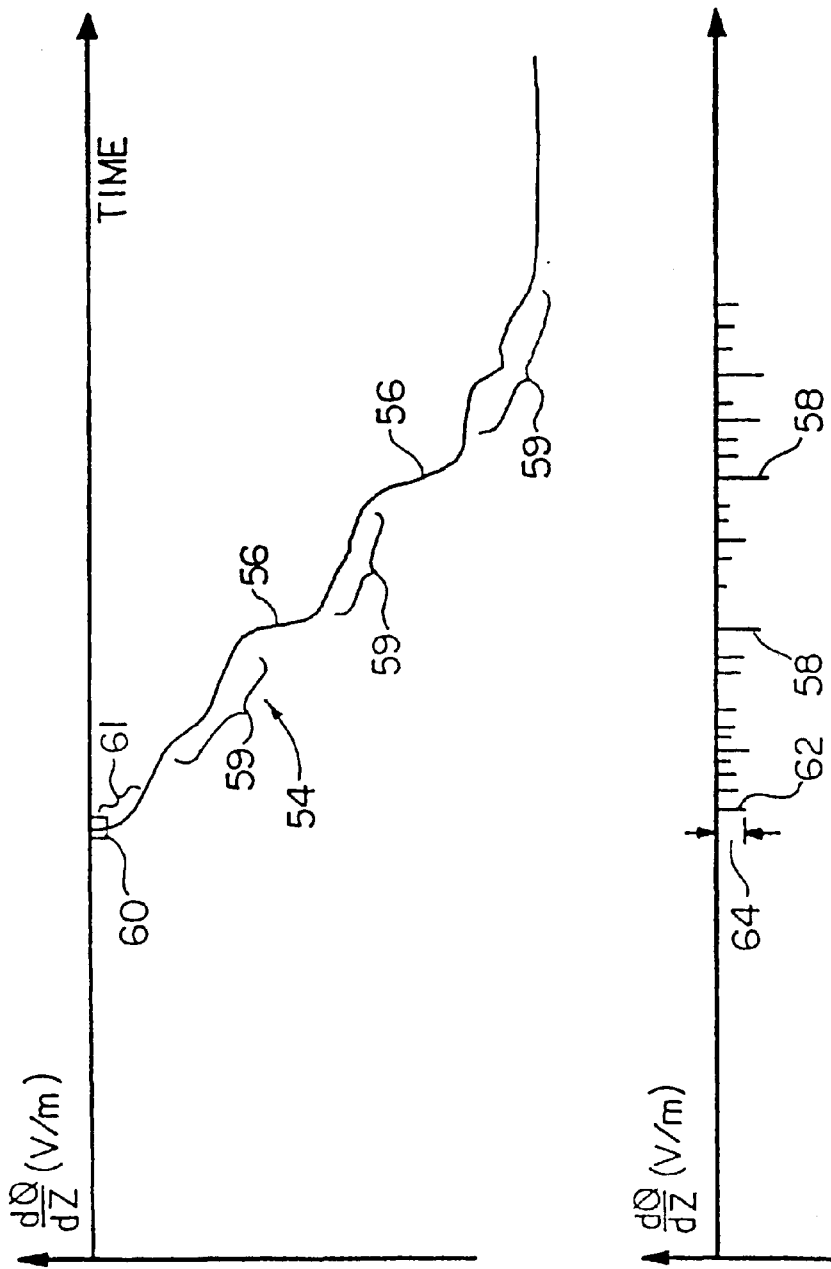
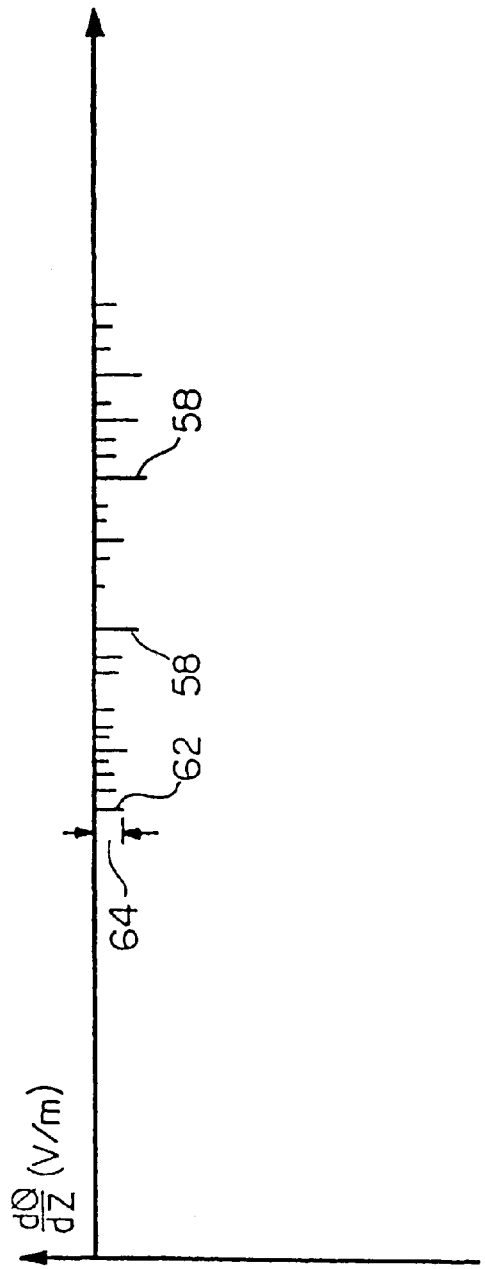
FIG. 4
FIG. 5

LIGHTNING LOCATING SYSTEM

RELATED CASE INFORMATION

The present application claims benefit of U.S. Provisional application Ser. No. 60/001,540, filed Jul. 26, 1995, and a continuation of Ser. No. 08/687,751 filed Jul. 25, 1996, U.S. Pat. No. 5,771,020.

FIELD OF THE INVENTION

The invention relates generally to lightning warning systems, and more particularly to an early lightning warning system for detecting and processing initial lightning discharges.

BACKGROUND OF THE INVENTION

Lightning includes electrical discharges within a cloud, intracloud (IC) discharges, and cloud to ground (CG) discharges (total lighting. Lightning occurs when electrical fields within a cloud intensify as particles of opposite polarity collect at differing regions within the cloud. Typically, the electric field forms as a result of strong updrafts which carry monopolar positive charge aloft leaving negative space charge in a central or lower part of the cloud. Precipitation and downdrafts can also transport negative space charge downward. The updrafts as downdrafts further contribute to the electrification of the cloud particles. Lightning generally occurs near the location of these intense updrafts and downdrafts.

Lightning begins with a an initial electrical breakdown (pulse) followed by leader channels from which a series or channel branches grow within a cloud forming a comprehensive branch channel structure. For IC lightning, the channel structure remains within the cloud. A CG discharge occurs when one or more branches extend from a cloud to the ground. The leader channel propagates in steps to the ground. When the leader channel is about 100 meters from the ground, a streamer propagates up from the ground to meet the stepped leader. When the two meet, a continuous channel of ionized air is formed from the cloud to the ground. At this point a large current flows from the ground to the cloud which is known as a return stroke.

Typical lightning detection systems, such as the Lightning Location and Protection (LLP) system used in the National Lightning Detection Network (NLDN), operate to detect CG return strokes. Generally, the return stroke associated with a CG discharge is many times larger than for IC discharges. Thus, such a system typically will not detect IC lightning. Also, the system assigns a location to the discharge corresponding to a position on the around and provides no information with respect to the stroke origin which may be tens of miles distant.

A further disadvantage of prior single sensor systems is susceptibility to RF noise. Since Very Low Frequency (VLF) signals are targeted for detection, systems for detecting CG return strokes can provide a general bearing of a storm using well known crossed loop technology, but are subject to gross errors with response to distance. In particular, single sensor VLF systems determine He distance of a lightning stroke from the stoke intensity, but stroke intensities can vary by two or three orders of magnitude. Thus it will be appreciated that these VLF systems do not have the capability to accurately determine lightning range from a single observation station.

Another disadvantage of known systems stems from display limitations with respect to lightning position More particularly, a single dot on a display typically represents a complete lightning flash. However, a lightning flash can extend for tens of kilometers from an initial leader. Thus a display of dots may provide a general area containing lightning discharges, but does not provide an accurate representation of the location of the source of the atmospheric disturbance. The source of the lighting is generally the area presenting the most severe aviation hazards, such as hail, icing, turbulence and microbursts.

A still further drawback of some systems is that in operation, the systems detect and process energy from many parts of the lightning channels of lightning strokes and the multitude of pulses from each stroke, thus requiring a tremendous processing capability. Such systems are complex and expensive.

With respect to known VLF single station lightning detection systems, there are considerable limitations associated therewith due to the inherent variation in lightning stroke discharge amplitudes. For example, a lightning channel structure includes a tremendous horizontal and vertical span radiating energy throughout. This produces polarization errors for azimuth and distance determination. Lightning discharges vary in intensity as much as three orders of magnitude, thus precluding accurate distance determination based on detected discharge intensity. Also, IC and CG discharges have different characteristics. These factors contribute to the problems of fabricating an accurate lightning detection system including the ability to distinguish between IC and CG lightning.

Often during thunderstorms, intense downdrafts, known as microbursts, follow lightning producing updrafts. Microbursts pose a threat to aircraft, especially immediately after take off and prior to landing where an aircraft is especially vulnerable. A further danger to aircraft results as a microburst approaches ground level and air flows horizontally creating a wind shear region possibly resulting in stalling the aircrafts and losing lift. In fact several hundreds of deaths have occurred in airplane crashes over the past few decades due to intense downdrafts, or microbursts and resulting wind shear. Since lightning generally begins near the locations of intense updrafts and downdrafts, the early detection of microbursts is critical in averting such disasters. This situation has been partially addressed by the Federal Aviation Administration (FAA) which has responded by situating weather radars, such as Terminal Doppler Weather Radars (TDWR), at various major airports across the United States. These radars measure the radial velocity of raindrops towards and away from the radar and infer air motions therefrom. However, despite the considerable cost, in the neighborhood of several millions of dollars, Doppler weather radars have limitations. For instance, if rainfall is vertical and the radar is scanning near the horizon, no radial velocity is detected, thus not detecting a possible downdraft. Doppler radars operate to detect outflow air having rain drops therein. Further disadvantages of weather radars are slow volume scans, for example up to three minutes to obtain one picture, performance degradations due to ground clutter, and significant cost.

Known lightning detection systems do not provide a way to determine potential microburst locations since there is no known correlation between CG discharges and microbursts. It will be appreciated by one skilled in the art that a VLF system detecting signals having wavelengths on the same scale as lightning channels is not well adapted for microburst prediction which requires defining lightning in scales of hundreds of meters. A VLF system detects a CG return stroke emitting VLF energy having a wavelength in the order of 10, but can rarely, if at all, detect the shorter stepped structure of IC lightning rich in HF and VHF radiation from which microbursts can be predicted.

Other technologies are currently being developed and exist to detect windshear conditions, such as laser, and Infra Red (IR) and Doppler radar based systems. While those technologies may be successful in ascertaining microbursts that have already developed, it is unlikely that event prediction will be attainable. Hazardous weather warnings would be in the vicinity of a few minutes, or seconds, and thus possibly not sufficient for an aircraft to avoid the danger.

In view of the above, a low cost total lightning warning system is desired which detects all lightning discharges and provides an early warning of lightning, accurate location including direction and range of the source of lightning, lightning type, and the location of potential microbursts.

SUMMARY OF THE INVENTION

The present invention overcomes the aforesaid and other disadvantages by providing a lightning detection system for detecting initial lightning discharges which allows lightning to be detected prior to cloud to ground strokes. The initial discharges provide information used to determine lightning location and possibly hazardous weather conditions such as intense updrafts and downdrafts or microbursts.

In a first embodiment, a lightning detection system includes at least three sensors disposed in locations known to a master station which is coupled to each of the sensors. The sensors detect a pulse produced by an initial lightning discharge of an initial lightning stroke. At each sensor, a time of pulse arrival is recorded which information is sent to the master station or processing. The master station uses the time difference of arrival of the pulse at the three sensors to determine the location in two dimensions of the origin of the initial discharge. Four or more sensors provides a location in three dimensions.

In another embodiment, a lightning detection system includes a single sensor for determining the location of an into a lightning discharge (RF pulse) The initial pulses are monopolar, either positive or negative and about one microsecond or less in duration. The sensor includes an E-field antenna and a crossed loop antenna. A distance for the initial discharge is determined from the amplitude of the detected pulse which is constant for initial pulses. Since the initial discharge is vertical with respect to ground and its associated RF pulse has the same amplitude for all first pulses, the range can be accurately determined since the amplitude is known to fall off as a function of distance. In conjunction with the E-field antenna, the crossed loop antenna provides a direction for the initial lightning pulse. An altitude for the initial pulse can be assigned base on the polarity of the corresponding pulse, since initial IC pulses are negative and CG discharges are positive.

A further embodiment of a single sensor lightning detection system detects a series of microsecond or shorter pulses emitted by a lightning stroke and determines a peak or average value from a distribution of the pulse amplitudes. This value can be used to determine the distance of the lightning event.

In an alternative embodiment, a lightning detection system includes a weather radar and a lightning detector for providing weather radar type display including lightning information.

BRIEF DESCRIPTION OF THE DRAWINGS

Other features and advantages of the invention will be apparent from the following detailed description of the invention in conjunction with the accompanying drawings in which:

FIG. 2 is graphical representation of a typical cloud to ground lightning flash showing a change in electrostatic potential over time;

FIG. 3 is a graphical representation of an electromagnetic signature of the cloud to ground lightning flash of FIG. 2;

FIG. 4 is graphical representation of a typical intracloud lightning flash showing a change in electrostatic potential over time;

FIG. 5 is a graphical representation of an electromagnetic signature of the intracloud lightning flash of FIG. 4;

DETAILED DESCRIPTION OF THE INVENTION

Figure 1:
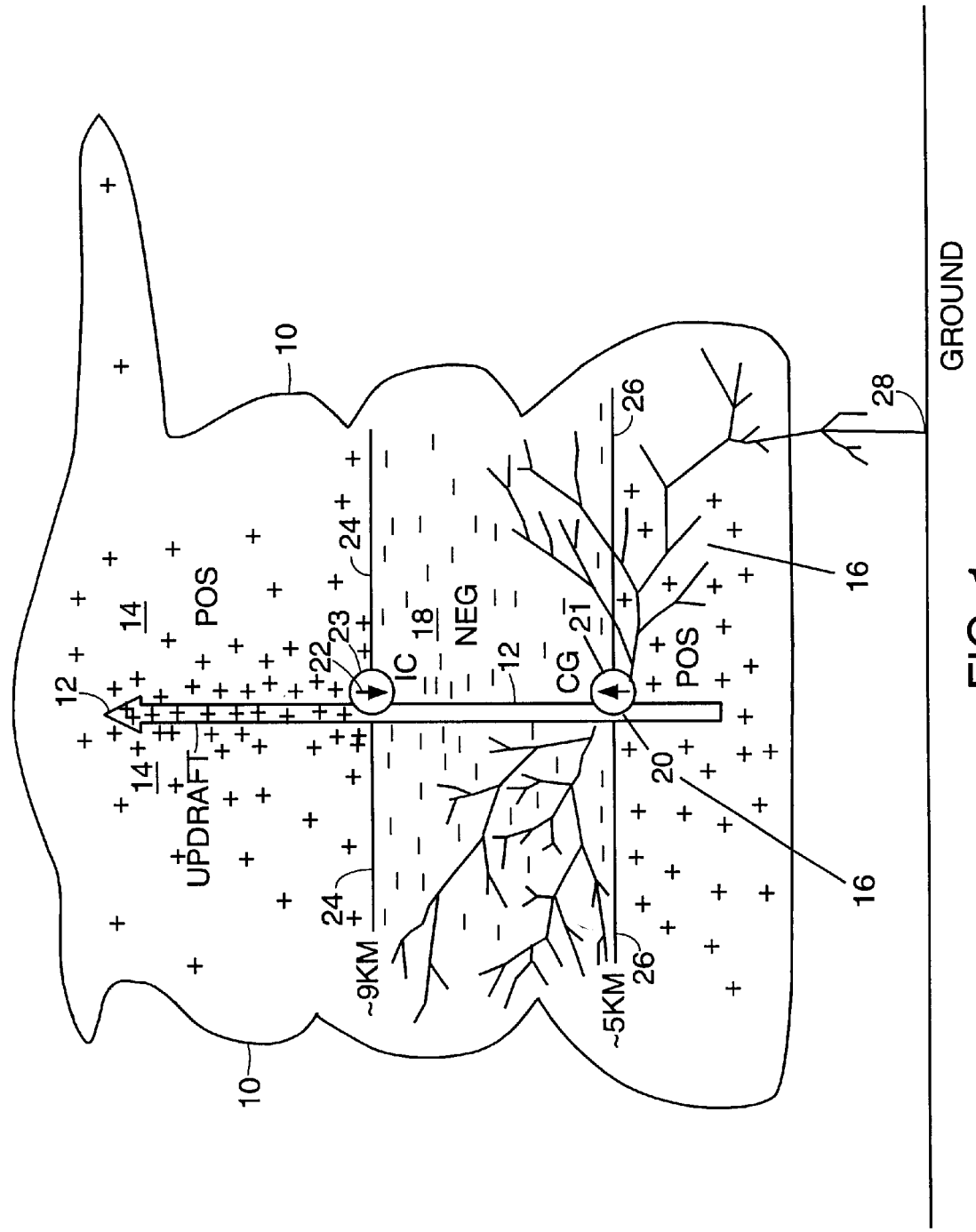
FIG. 1 is a pictorial representation of lightning forming in a cloud.

As shown in FIG. 1, lightning is a result of an electrical potential gradient in a cloud 10 formed as an updraft 12 in a cloud convective cycle carries positive charge to an upper portion 14 of the cloud. Positive charge remains in a lower portion 16 of the cloud so that a middle layer 18 having a majority of negative charge is formed between the upper and lower portions 14,16 of the cloud. Large electrical vertical potential gradients (which control the direction of the initial are thus developed near the boundaries between the negative and positive space charge at the top 24 and the bottom 26 of the layer 18 leading up to an initial vertical lightning discharge through non-ionized air forming a channel. The initial vertical discharge provides initial ionization of the air forming a channel of ionized air.

An initial IC discharge 22 originates at a first intersection 24 of the upper portion 14 and the middle portion 18 of the cloud 10. Generally, the intersection is about 9 km in altitude for a mature thunderstorm, but may initially be at 6 or 7 km. An initial CG discharge 20 originates at a second intersection 26 of the lower portion 16 and the middle portion 18 of the cloud 10. Typically, the altitude of the initial CG discharge is about 5 km. The initial IC and CG lightning discharges 22,20 are substantially vertical. It will be appreciated that the initial CG discharge 20 and the initial IC discharge 22 will be of opposite polarity. The initial IC and CG discharges form a portion of an initial leader stroke from which a series of channel branches grow forming a comprehensive branch channel structure 28. A series of strokes flows through the channel structure, which is known as a flash. A flash is generally observed as flickering as lightning channels emit light.

The initial IC and CG discharges are virtually identical except for polarity. However, although IC discharges are present throughout a thunderstorm, IC discharges almost always precede a CG stroke reaching the ground by ten or more minutes. Thus IC detection is critical to providing an early warning of thunderstorms, prior to CG lightning strokes reaching the ground. In fact, IC lightning detection is far more accurate in detecting thunderstorms, since some thunderstorms do not produce any CG lightning and others produce only a few CG flashes.

As shown in FIG. 2, an electrostatic signature of a CG flash 32 includes an initial leader stroke signal 34, an initial return stroke 36, followed by subsequent strokes 38 and subsequent return strokes 40. The CG flash 32 thus includes a plurality of strokes. As shown, a series of positive steps, seen as return stroke signals 36,40, represent CG discharges. The initial leader stroke 34 includes an initial discharge 42 at the very beginning of the initial leader stroke The CG flash 32 stretches over several hundred milliseconds, and is detectable by a "slow antenna" sampling as low as 0.1 Hz for measuring the electrostatic potential difference over time.

FIG. 3 illustrates the detected RF energy from the CG flash 32 of FIG. 2. Corresponding to the initial discharge 42 of the initial leader stroke 34, there is an initial pulse 44. The initial pulse 44 has a characteristic amplitude 46, energy and duration that is relatively constant. The initial return stroke 36 produces a corresponding initial return stroke pulse 48. The subsequent return stroke 40 correspond to return stroke pulse 50. The return stroke pulses 50 are followed by Q-bursts 52, represented as a series of pulses having an amplitude lower than that of the return stroke pulses.

FIGS. 4 and 5 illustrate an electromagnetic signature and corresponding resulting pulses of an IC flash 54. As can be seen, the IC flash 54 includes negative steps which are less pronounced in comparison with the CG flash 32. A recoil streamer 56, similar to but generally smaller than a CG return stroke, produces a corresponding pulse 58. An initial discharge 60 of an initial IC leader stroke 61 corresponds to an initial RF pulse 62 having a characteristic amplitude 64, energy and duration substantially matching that of the CG initial pulse, except in polarity. It will be appreciated that detecting and processing initial IC and CG pulses provides an advance in the art over known lightning detection systems.

Figure 6:
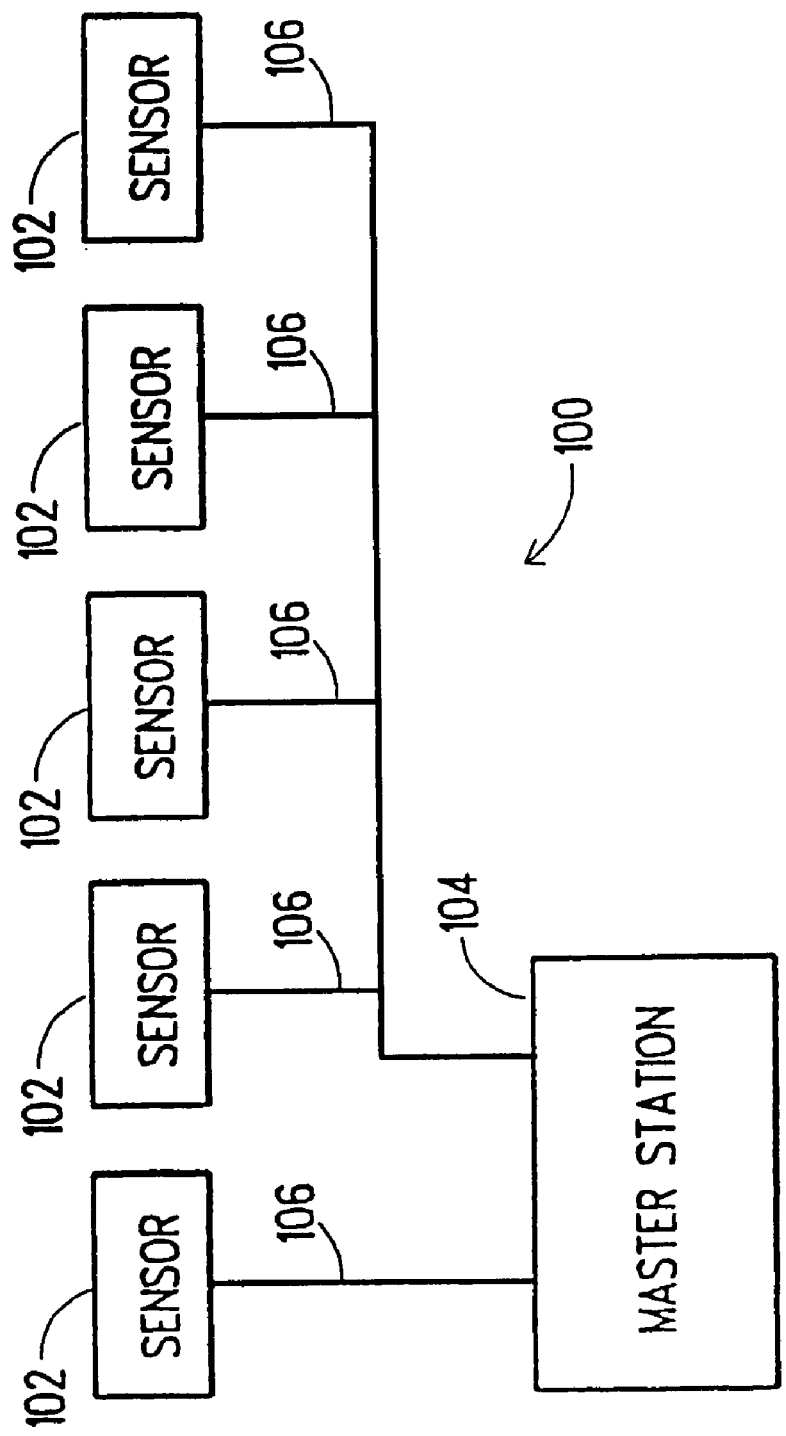
FIG. 6 is a block diagram of a first embodiment of a lightning detection system according to the present invention.
Figure 7:
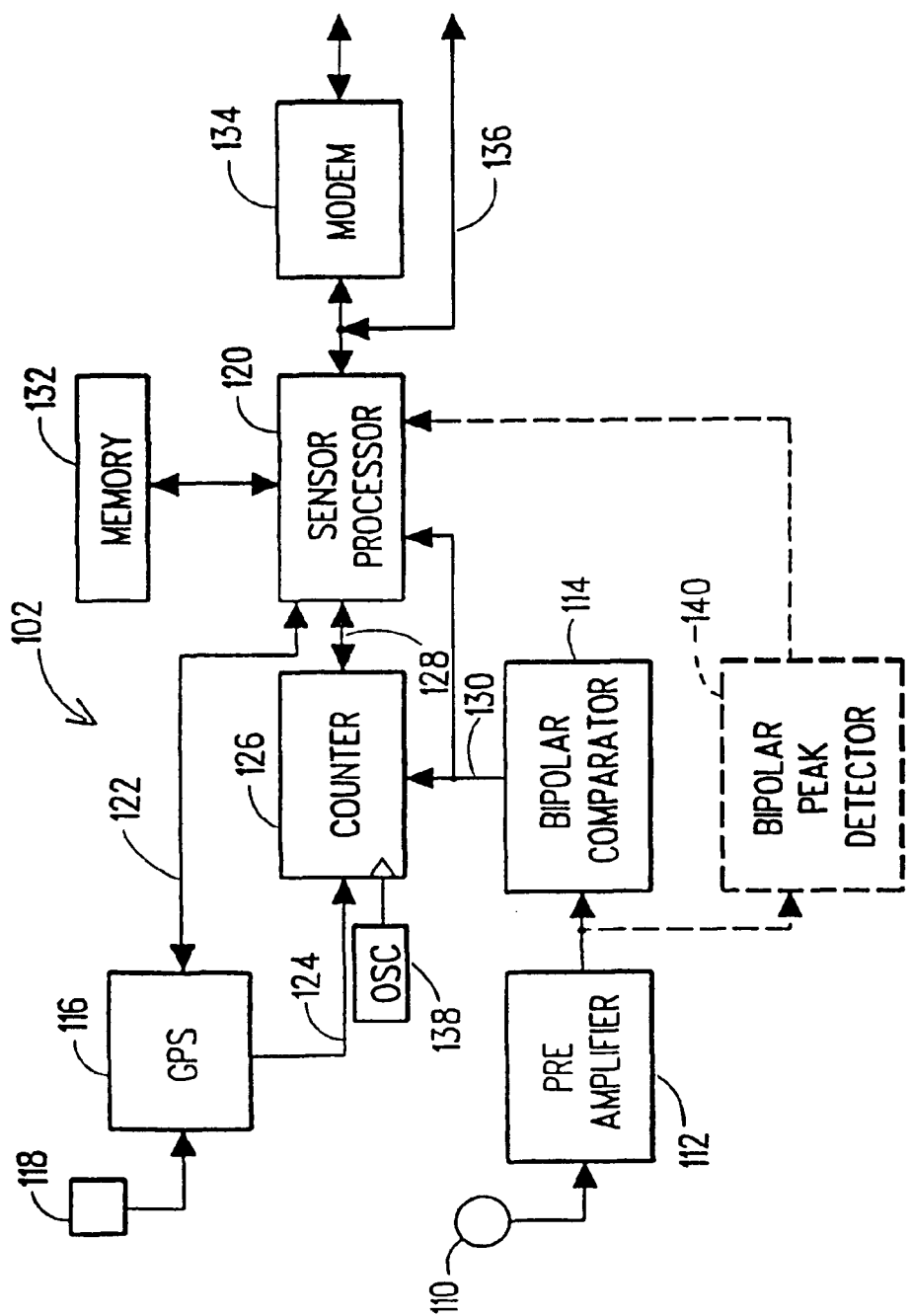
FIG. 7 is a block diagram of a sensor forming a part of the lightning detection system of FIG. 6.
Figure 8:
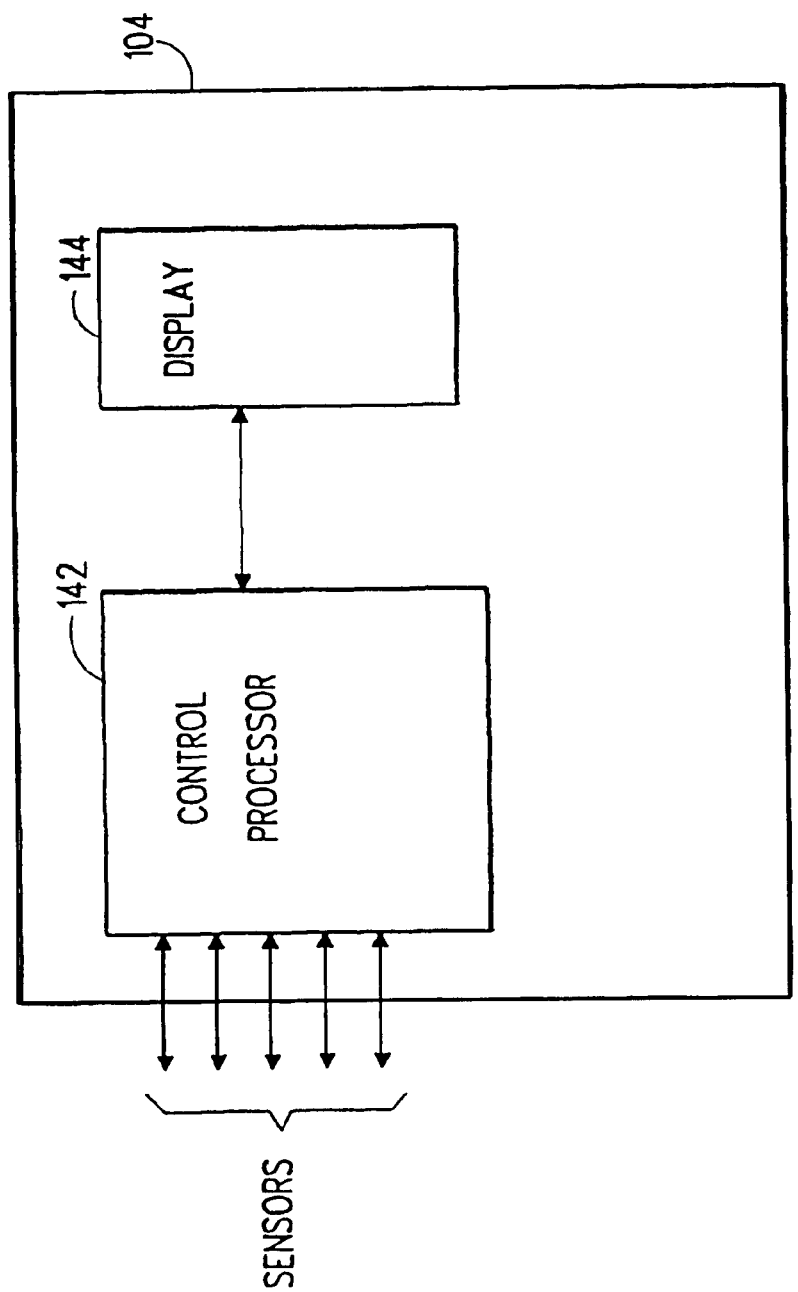
FIG. 8 is a block diagram of a master station forming a part of the lightning detection system of FIG. 6.

In a first embodiment as shown in FIGS. 6–8, a lightning detection system includes a plurality of sensors for detecting RF energy from lightning discharges. It is believed, but without limitation thereto, that RF energy transmitted by virtually all initial lightning discharges within a cloud are substantially vertical with respect to ground. It is further believed that RF pulses produced from almost all initial lightning discharges, IC and CG, are substantially similar with respect to energy, amplitude, and duration, regardless of the eventual energy of a stroke, or whether the discharge eventually reaches around. Thus an initial lightning discharge and corresponding pulse can be the basis for early and accurate lightning detection and location.

A first embodiment of a lightning detection system 100 includes five sensors 102 and a master station 104 for collecting and processing data from the sensors. The sensors 102 are configured in spaced apart relationship wherein the exact location of each sensor is known to the master station 104. In an exemplary embodiment, sensors 102 are placed in a cross-configuration with one sensor centrally located within the cross and disposed within a twenty-five mile radius. A (Global Positioning System) GPS unit associated with each sensor can provide a location accurate to about fifty feet, but in an illustrative implementation, the accuracy of each sensor with respect to latitude and longitude is known to within 10 feet. Each of the sensors 102 is connected to the master station 104 via telephone line or by a RS-232 serial computer link 106. An RS-232 link is adapted for a sensor in the vicinity of the master station.

Different configurations of the sensors are possible in alternative embodiments. For a three-dimensional system a minimum of four sensors is necessary and for a two-dimensional system, three sensors are required. In one embodiment, at least one sensor is located in the general vicinity of an airport. Alternatively, one or more sensors can be located on aircraft and provide information to a master station and to other aircraft. The sensors can be placed hundreds of miles apart with sufficient sensor sensitivity providing improved accuracy of lightning location. As a further alternative, sensors can be placed at aircraft wingtips. Although the wingspan distance is limited, autocorrelation techniques reduce error to an acceptable level. In another embodiment, lightning data is provided to unmanned lightning warning stations typically located near smaller airports.

Referring now to the block diagram of FIG. 7, each sensor 702 includes a lightning antenna 10 in communication with a pre-amplifier 112 for amplifying a signal provided by the antenna. In an exemplary embodiment, the antenna 110 detects RF energy in a range from 150 kHz to 50 MHz. A bipolar comparator 114 is coupled to the pre-amplifier 112 for detecting pulses having characteristics within predetermined ranges corresponding to an initial lightning discharge. A detected pulse generally has a duration of about a microsecond or less with a rise time of about one hundred nanoseconds and a fall time somewhat longer. The comparator is bipolar in that positive and negative pulses are detected. A GPS unit 116, including a GPS antenna 118, provides location, time, and date information to a sensor processor 120 via a bi-directional GPS data signal 122 which also allows the sensor processor to communicate with the GPS unit. The GPS unit 116 provides a one second pulse signal 124 to a counter 126 which is coupled to the processor 120 by a count value signal 128. The comparator 114 is connected to the counter 126 and sensor processor 120 by an event signal 130. In an exemplary embodiment, the event signal 130 is connected as an interrupt to the sensor processor 120. Coupled to the sensor processor 120 is memory 132 for providing event data storage capability. A modem 134 and serial link 136 are coupled to the sensor processor 120 to provide stored event information to the master station 104.

The GPS unit 116 a provides a frame of reference with respect to time. It will be appreciated that other methods can be used to provide a time reference. The GPS unit 116 can also provide a location for the sensors (within about 50 feet) but greater accuracy is afforded by surveyed latitude and longitude measurements (within 10 feet) The pulse signal 124 from the GPS unit 116 is active once per second and is operative to reset the counter 126. The counter 126 is incremented by a crystal oscillator 138 having a frequency of about 40 MHz, thus providing a clock period of about 25 ns.

In operation, the comparator 114 activates the event signal 130 upon detecting a pulse having an amplitude greater than a predetermined amplitude The active event signal 130 stops the counter 126 from incrementing and provides an interrupt to the sensor processor 120. The sensor processor 120 reads the value in the counter 126 via the count value signal 128 which corresponds to the time of the detected pulse. The counter 126 provides a "time stamp" for the event. More particularly, the time of the detected pulse is known by the value in the counter 126 which corresponds to the time since the last one second pulse from the GPS unit 116. The sensor processor 120 then prohibits any further event signals to the counter 126 for a predetermined time, 0.5 to 1.5 seconds for example. This allows the GPS unit 116 to reset the counter 126. Each initial discharge pulse (event) detected by the comparator 114 has assigned thereto event information including GPS location, date, and time, and time from the most recent one second GPS time update (counter value), and polarity. The pulse information is held in memory 132 under control of the sensor processor 120. The minimum storage capacity of the sensor is 100 lightning events. The stored event information in the memory 132 is retrieved by the master station 104 via modem or serial link. As shown in phantom, in a further embodiment, the sensor 102 can also include a bipolar peak detector 140 coupled in between the preamplifier 112 and sensor processor 120 for providing peak voltage information for the event.

In exemplary embodiments discussed herein, references to an initial pulse associated with an initial lightning leader may also include a series of subsequent pulses For example a predetermined number of pulses, such as 5 or 10 pulses, from the first part of the initial leader may be processed to provide verification of a first initial pulse. Or processing may include an average over several pulses to improve accuracy. Furthermore, a time sample may be on the order of a millisecond or more Typically, prior to an initial discharge there is a period, typically at least about one hundred milliseconds, of relative quiet with respect to detected RF radiation. Exemplary embodiments can provide for periods of about a one-tenth second to 1 second before a system is ready to process another initial pulse or event However, the present invention includes alternative embodiments that continually process lightning events.

As shown in FIG. 8, the master station 104 includes a control processor 142 and a display 144. Event information associated with an initial lightning discharge pulse is retrieved by the control processor 142 for processing and providing the processed information to the display 144 for viewing by a user. The master station 104 polls each of the sensors 102 for event data and requests stored event data if any is present. The master station 104 processes event data acquired from the sensors 102 to determine a location of an event in three dimensions. The control processor 142 first groups events according to the time of arrival (TOA) of the event. An algorithm may be used to determine the location, including altitude, of the initial lighting discharge corresponding to the detected pulse (event) from the time difference of arrival (TDOA) of the detected pulses. Least mean square algorithms are used to determine the most probable location if there is more than one solution which occurs if more than four sensors are used. Processed lightning event data is displayed on the display 144. The control processor 142 in conjunction with the display 144 provides information with respect to lightning stroke rate and the rate of change with respect to the lightning rate. The stroke rate and rate of change are available for IC and CG lightning individually, and for the total lightning rate, i.e., IC and CG lightning.

Figure 9:
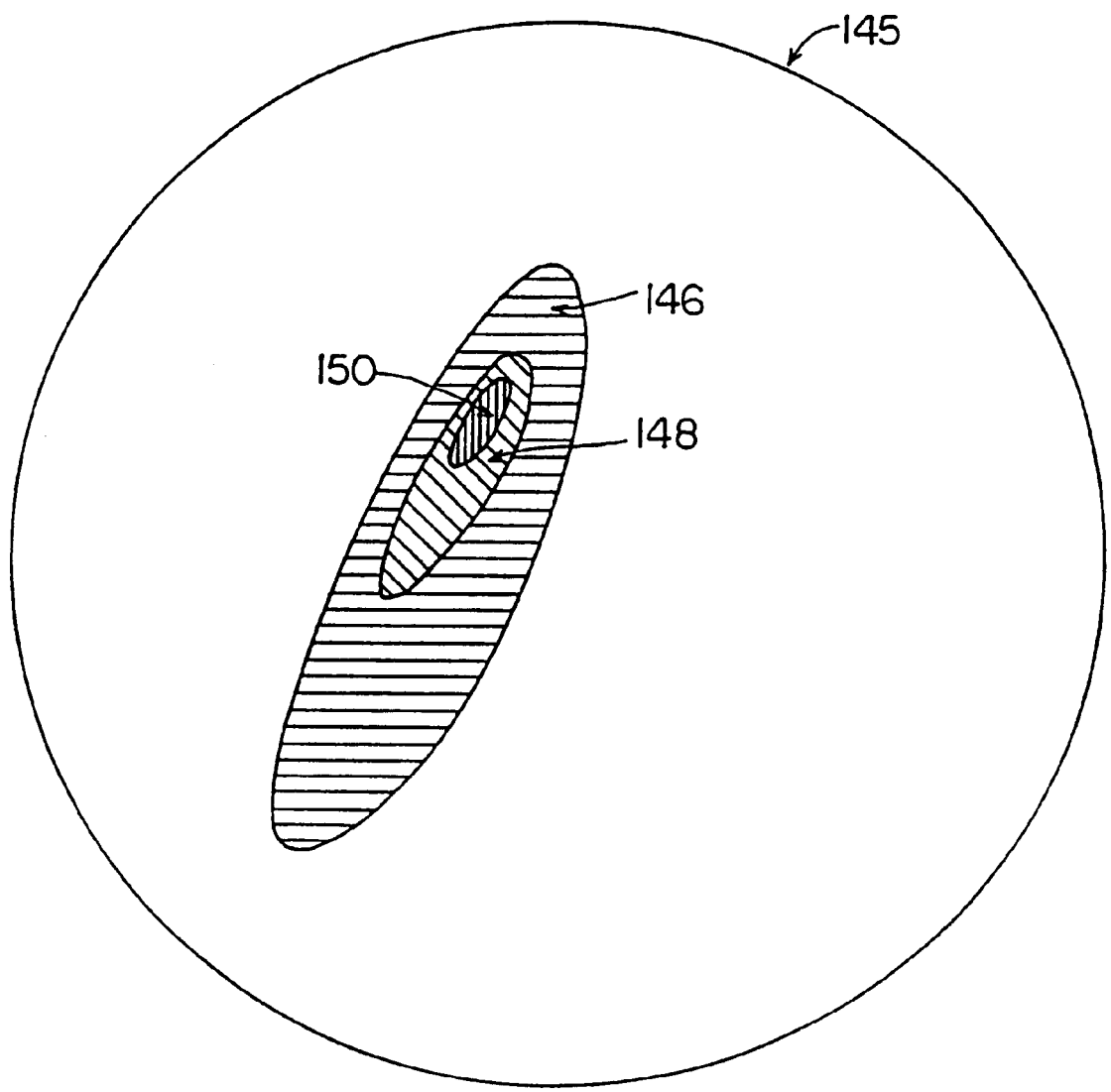
FIG. 9 is pictorial representation of an exemplary display for the lightning detection system of FIG. 6.

FIG. 9 is an exemplary display 145 of collected initial lightning discharge information As can be seen, the display 145 shows areas of varying lightning intensity, such as low hazard 14 a, medium hazard 148, and high hazard 150. It will be appreciated that other display embodiments can include differentiation by color, or dimension. For example, a three-dimensional display can provide altitude information. In an alternative embodiment, a single or multiple displays can provide information relating to two or more height ranges.

The high resolution mapping and intensity determination of IC lightning provide the lightning detection system the ability to predict microburst events. Microbursts can be detected from IC lightning as discussed below, and disclosed in U.S. Pat. No. 4,996,473 to Markson et al., incorporated herein by reference. A microburst downdraft is generally about 1–2 km in diameter, within the resolution for the lightning detection system of the present invention. Since lightning is caused in part by updrafts in a convective cycle, it follows that along the perimeter of the updraft, IC lightning discharges occur. It is known that a microburst is preceded by a an updraft, thus allowing microburst prediction based on IC lightning having certain characteristics, and in particular a sharp increase in the lightning discharge rate in a cell sized region. In particular, there is a sharp monotonic increase in lightning rate which maximizes about 5 to 10 minutes before a maximum outflow velocity associated with a microburst. For example, when the IC lightning rate increases to a rate of 5 strokes per minute, or more, followed by rate decay, there is a greater than 90% chance that a =microburst will occur.

Pulse information also provides a measure of storm intensity derived from strokes per minute. In typical lightning detection systems, storm intensity cannot be measured because they cannot detect or or locate most IC flashes. A lightning detection system according to the present invention provides storm intensity as a function of flashes per unit time.

Cloud height is also an important factor in a determination of storm intensity. Lightning is proportional to the $5^{th}$ power of cloud height. It follows that a 10% increase in cloud height, results in a 60% increase in the lightning rate The increase in cloud height may not be detected by radar. As air velocities in convective clouds are proportional to cloud height, vertical air motion, (updraft velocities), are closely related to lightning rates. An advantage of accurate thundercloud location includes the ability to allow a plane to fly under or around thunderclouds, thereby minimizing air traffic interruptions. The cost, delay and frustration associated with weather delays is well known. Thus, it will be appreciated that a lightning detection system providing accurate lightning discharge altitudes provides a significant advantage.

Lightning information is used to provide hazardous weather warnings to aircraft. Dangers for aircraft near a thunder cloud include hail, icing, turbulence, microbursts, and being hit by lightening. The amplitude ratio of CG to IC lightning is about 10:1 at about 10 kHz, while above 1.5 MHz, the ratio is about 1:1. While VHF signal energy attenuates at a rate of one over frequency, VHF lightning radiation can be detected at a distance of at least 200 km. At higher frequencies the signal is smaller, as is the noise, so that the S/N ratio remains about the same. In other embodiments, a lightning detection system includes differentiation of lightning discharges by frequency ranges, providing a plurality of frequency bins which would also be available for processing.

A lightning detection system can be in data communication with aircraft via Mode S and other data links. Air-ground data link communication is expected to be available across the country in the next few years. Lightning data is provided to aircraft enabling a pilot to avoid hazardous weather conditions, yet minimize unnecessary rerouting.

As an alternative to TDOA processing, a further embodiment includes the utilization of direction finders to determine the location of an initial discharge pulse. Direction finders are known in the lightning detection art. In another embodiment, at least one direction finder is disposed on an aircraft. Information from the direction finder is communicated to a master station via a Mode S transponder or another data link. A further embodiment includes lightning sensors disposed on a plurality of aircraft to form an airborne lightning detection network, constantly updating a lightning database.

FIGS. 10–14 illustrate a second embodiment of a lightning detection system having a single sensor. Prior single sensor lightning detection systems have been unable to accurately provide range data for lightning due in large part to lightning variations in intensity and direction. The lightning detection system of the present invention takes advantage of the known characteristics of an initial pulse of a lightning discharge to determine the location of the discharge source and to infer the altitude from differentiating between an IC and CG pulse In particular, the initial lightning discharge is vertical with respect to ground and has a known amplitude that falls off as a function of distance. The initial pulse also has a known duration of about one microsecond or less. Furthermore, IC and CG discharges are distinguishable by polarity. The single sensor system is adapted for placement on an airplane or ground.

An exemplary single sensor lightning detection system 200 includes an E field antenna 202 and a crossed loop antenna 204, including a reference loop 206 and a quadrature loop 208, for detecting respective electric field and magnetic field components of a traveling wave radiated by an initial lightning discharge. The E-field antenna 202 is coupled to an E-field amplifier and filter 210, the reference loop antenna 206 is coupled to a reference amplifier and filter 212, and the quadrature loop antenna 208 is coupled to a quadrature amplifier and filter 214. Each of the respective amplifier filters 210,212,214 is coupled to a respective E-field, reference, and quadrature pulse measurement circuit 216,218,220 each providing analog input signals to an A/D converter 222. The filters for the magnetic and electric signal paths have the same characteristics in an exemplary embodiment. The A/D converter 222 provides an output signal to a processor 224. The E-field amplifier and filter 210 is also coupled to a signal filter 226, which in turn provides an output to a pulse detector circuit 228. The pulse detector circuit 228 is coupled to a logic circuit 230 which provides a timing signal to each of the pulse measurement circuits 216,218,220. The logic circuit 230 is coupled to the processor 224. The processor 224 provides a serial data output signal 232.

Figure 11:
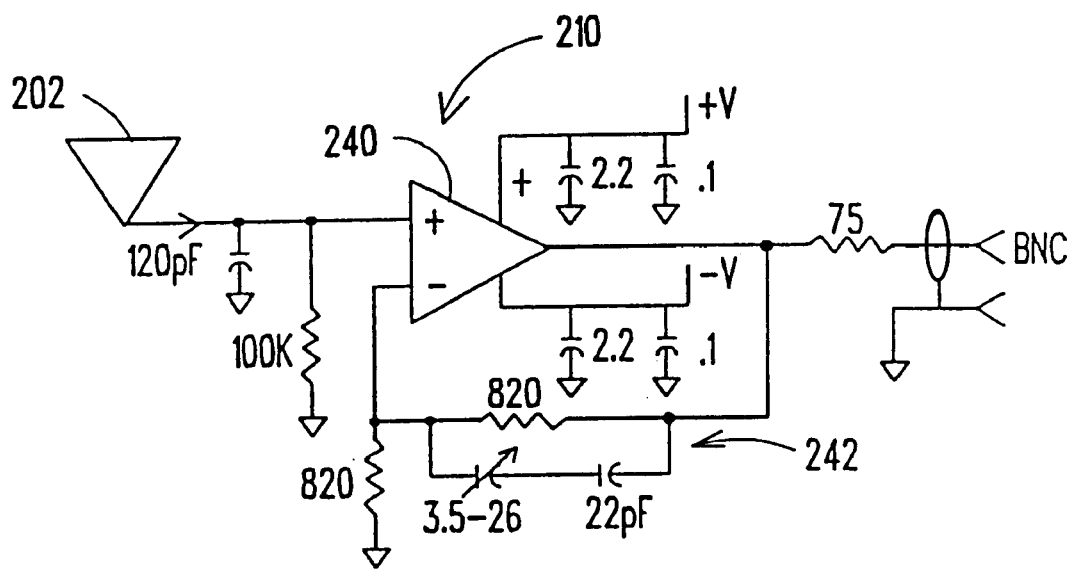
FIG. 11 is a circuit diagram of an E-field antenna and amplifier forming a part of the lightning detection system of FIG. 10.

FIG. 11 illustrates one embodiment of an E-field antenna 202 and amplifier circuit 210. The antenna 202 is flat plate in a first embodiment having a diameter of about 3 cm with a capacity of about 20 pfd. Other embodiments for the antenna include a thin wire and a sphere. The amplifier circuit 210 includes an amplifier 240 and an RC network 242 coupled in a feedback relationship with the amplifier. The antenna 202 is coupled to a positive input of the amplifier 240. The sensitivity of the circuit is determined by ratio of the shunt capacity of the amplifier inputs to the antenna capacity. The shunt resistance and shunt capacity determine the low frequency cutoff of the E-field channel and the high frequency cutoff is determined by the RC network 242 capacitance.

Figure 12:
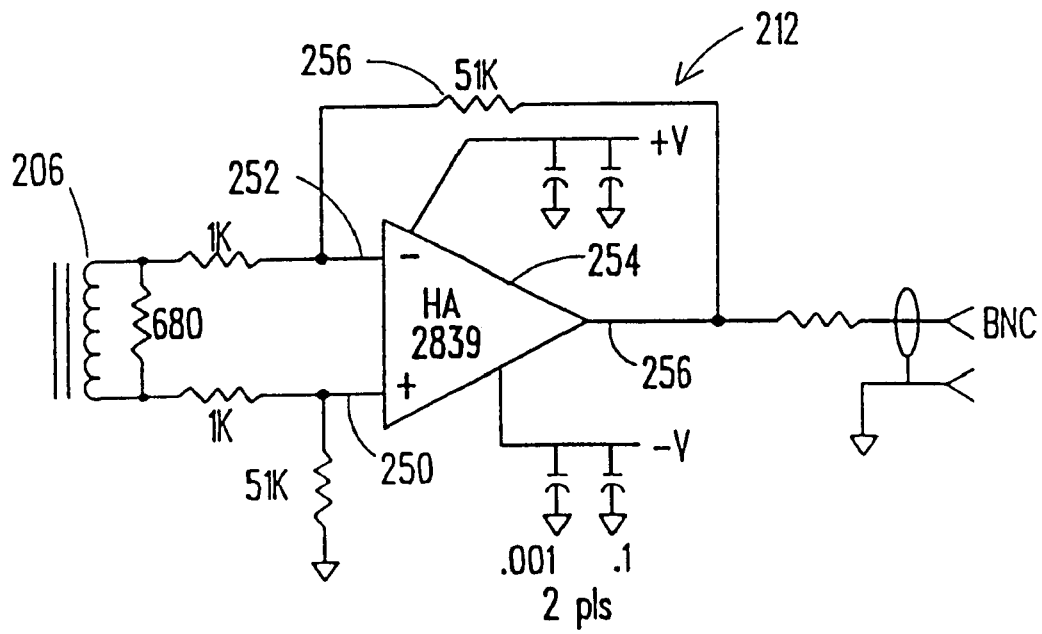
FIG. 12 is a circuit diagram of a loco antenna and amplifier forming a part of the lightning detection system of FIG. 10.

FIG. 12 illustrates an exemplary embodiment of a reference loop antenna 206 and amplifier circuit 212. In an exemplary embodiment, the quadrature loop antenna 208 and amplifier circuit 214 are equivalent to the reference circuits. The reference loop antenna 206 includes a 6 cm long antenna having a time constant about the same as the E-field flat plate antenna 202. Two coil direction finders are well known in the art. It will appreciated that many other alternatives are possible. The loop antenna 206 includes ferrite rods having a multi layer winding and is electrostatically shielded. The loop antenna 206 is connected across a positive input 250 and a negative input 252 of a wide band differential op amp 254. An output 256 of the amplifier is coupled to the negative input 252 in a feedback relationship through a resistor 256. The low frequency cutoff of the circuit 212 is determined by the coil terminal resistance and the high frequency cutoff is determined by the first order resonant frequency.

Figure 10:
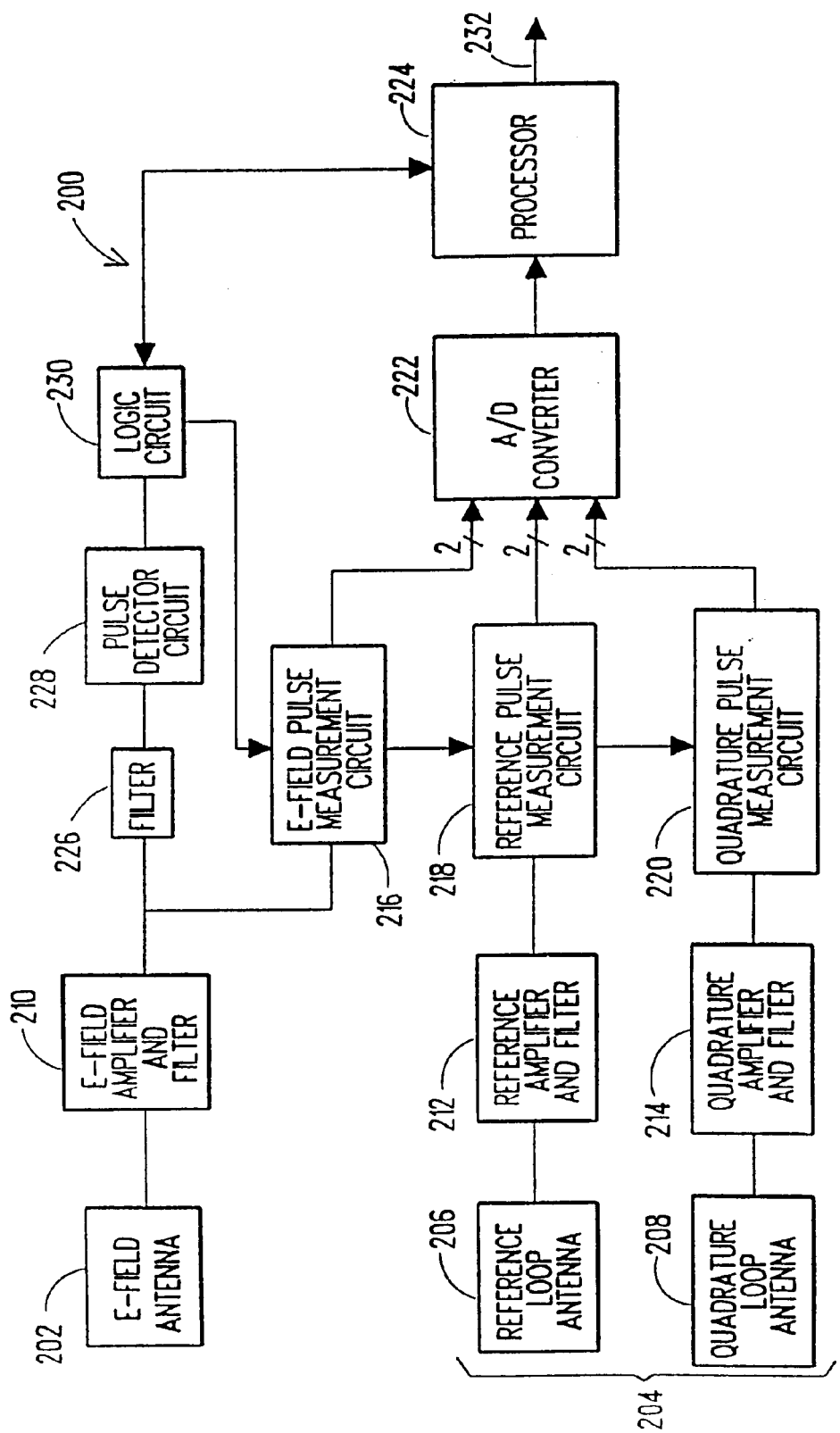
FIG. 10 is a block diagram of a further embodiment of a lightning detection system according to the present invention.
Figure 13A:
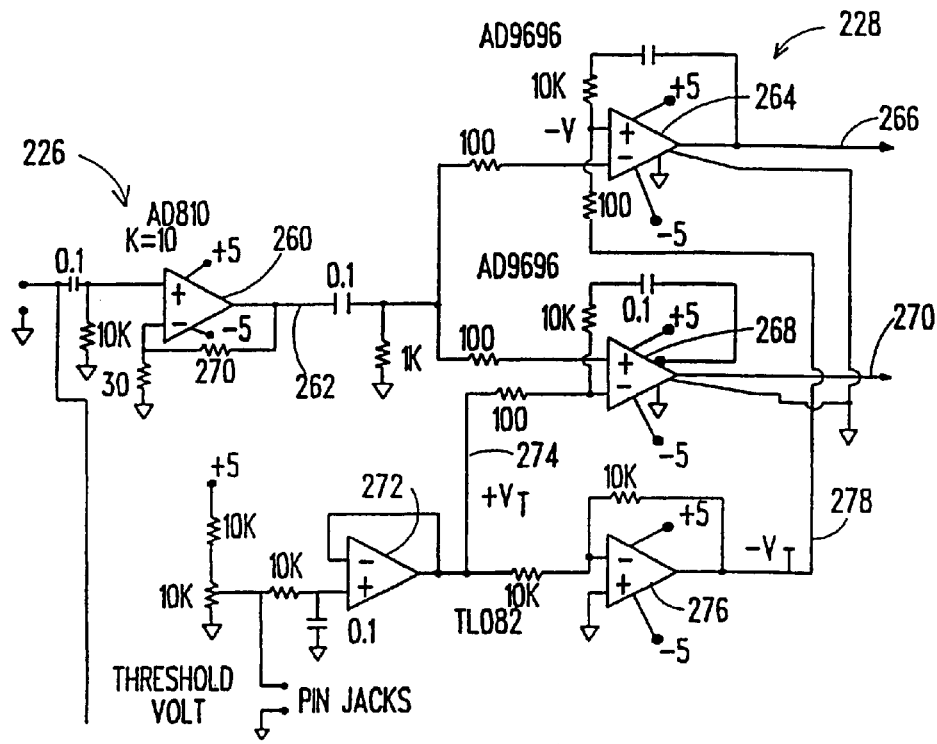
FIG. 13A is a circuit diagram of an E-field pulse detection circuit forming a part of the lightning detection system of FIG. 10.

FIG. 13A shows one embodiment of the filter 226 and bipolar pulse detection circuit 228 of FIG. 10. The output of the E-field amplifier and filter circuit 210 provides a signal to the pulse detection circuit 228 which compares the voltage of a potential pulse to a predetermined voltage threshold. The pulse detection circuit 228 includes a first amplifier 260 providing a pulse voltage level signal 262 to a first comparator 264 having an output signal 266 and to a second comparator 268 having an output signal 270. A first reference amplifier 272 provides a positive threshold voltage signal 274 to the second comparator 268, and a second reference amplifier 276 provides a negative threshold voltage signal 278 to the first comparator 264.

In operation, when the pulse voltage level signal 262 provides a positive voltage level to the second comparator 268 greater than the positive threshold voltage signal 274, the second comparator output signal 270 is active. When the pulse voltage level signal 262 provides a negative voltage level to the first comparator 264 greater than the negative threshold voltage signal 278, the first comparator output signal 266 is active. It will be appreciated that other embodiments for the described circuit are possible.

Figure 13B:
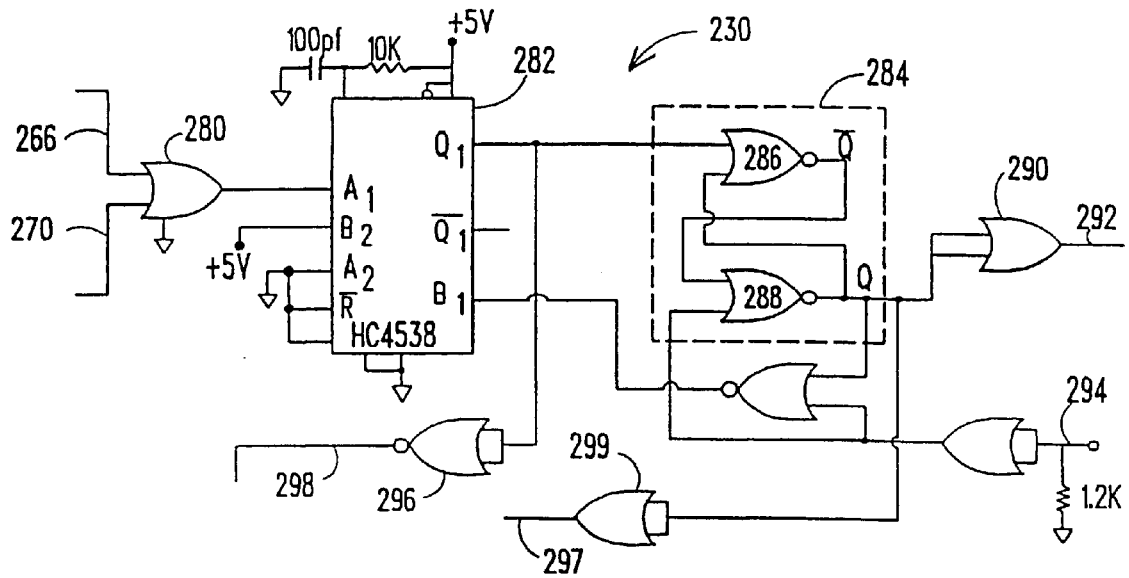
FIG. 13B is a circuit diagram of a logic circuit forming a part of the lightning detection system of FIG. 10.

FIG. 13B shows an exemplary embodiment of the logic circuit 230 of FIG. 10. The logic circuit 230 includes a first OR gate 280 coupled to a one-shot multivibrator 282. The first OR gate 280 receives the first and second comparator output signals 266,270. A latch 284 comprising first and second NOR gates 286,288 is coupled to the multivibrator 282. A second OR gate 290 is coupled to the latch 284 and provides a pulse detected signal 292 to the processor 224 of FIG. 10. The latch 284 receives a reset signal 294 from the processor 224. Also coupled to the multivibrator 282 is an inverter 296 providing a hold/detect signal 298. Also coupled to the latch 284 is a buffer 299 providing a measure/reset signal 297. In operation, when either of the first or second comparator output signals 266,270 (FIG. 13A) is active, the first OR gate 280 triggers the one-shot 282, which sets the latch 284 activating the pulse detect signal 292 to the processor 224 (FIG. 10). The triggered one-shot 282 activates the hold/detect signal 298. After the processor 224 detects the active pulse detect signal 292, the processor causes the reset signal 294 to become active after a predetermined amount of time, thus resetting the latch 284 and the measure/reset signal 297.

Figure 14:
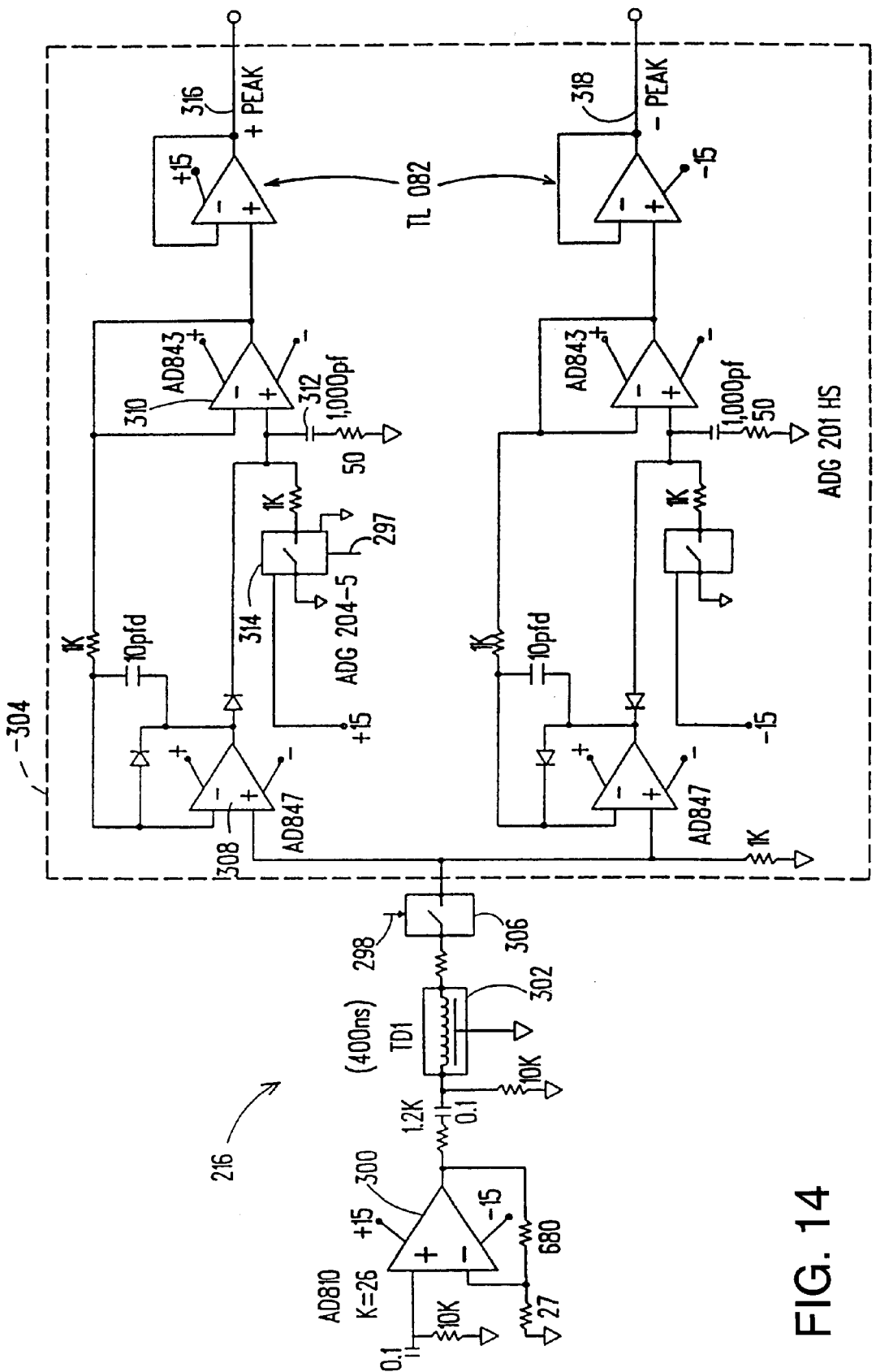
FIG. 14 is a circuit diagram of pulse measurement circuit forming a part of the lightning detection system of FIG. 10.

FIG. 14 is an illustrative embodiment of the pulse measurement circuits 216,218,220 of FIG. 10. The pulse measurement circuit coupled to each of the amplifier and filter circuits 210,212,214 is equivalent in an exemplary embodiment. The pulse measurement circuit 216 includes an amplifier 300 having a gain of about 26 and a delay circuit 302 providing a delay of about 400 ns coupled to an output of the amplifier 300. The delay allows switching transients to settle. The circuit 216 includes a peak detection circuit 304 which includes parallel paths for processing positive and negative pulses. At an output of the delay line 302 and prior to the pulse detection circuit 304, a first switch 306 is coupled. The first switch 306 activated by the hold/detect signal 298 of FIG. 13B, enabling pulse information to propagate to the peak detection circuit 304. The peak detection circuit 304 includes first and second amplifiers 308,310, wherein for a voltage greater than a predetermined level, a capacitor 312 charges to present a voltage at the capacitor to the second amplifier 310. A second switch 314 is coupled to an input of the second amplifier 310 in parallel with the capacitor 312 for discharging the capacitor thereby effectively turning off the circuit when the measure/reset signal 297 of FIG. 13B is not active, i.e., there is no pulse to be measured. It will be appreciated that peak detection circuits are well known to one skilled in the art. In an exemplary embodiment, the peak detection circuit 304 has a response time of about 50 ns. The peak detection circuit 304 provides a positive peak value signal 316 and a negative peak value signal 318 to the A/D converter 222 of FIG. 10. The A/D converter 222 receives positive and negative peak values signals for each of the respective E-field, reference, and quadrature circuit paths.

Figure 15A:
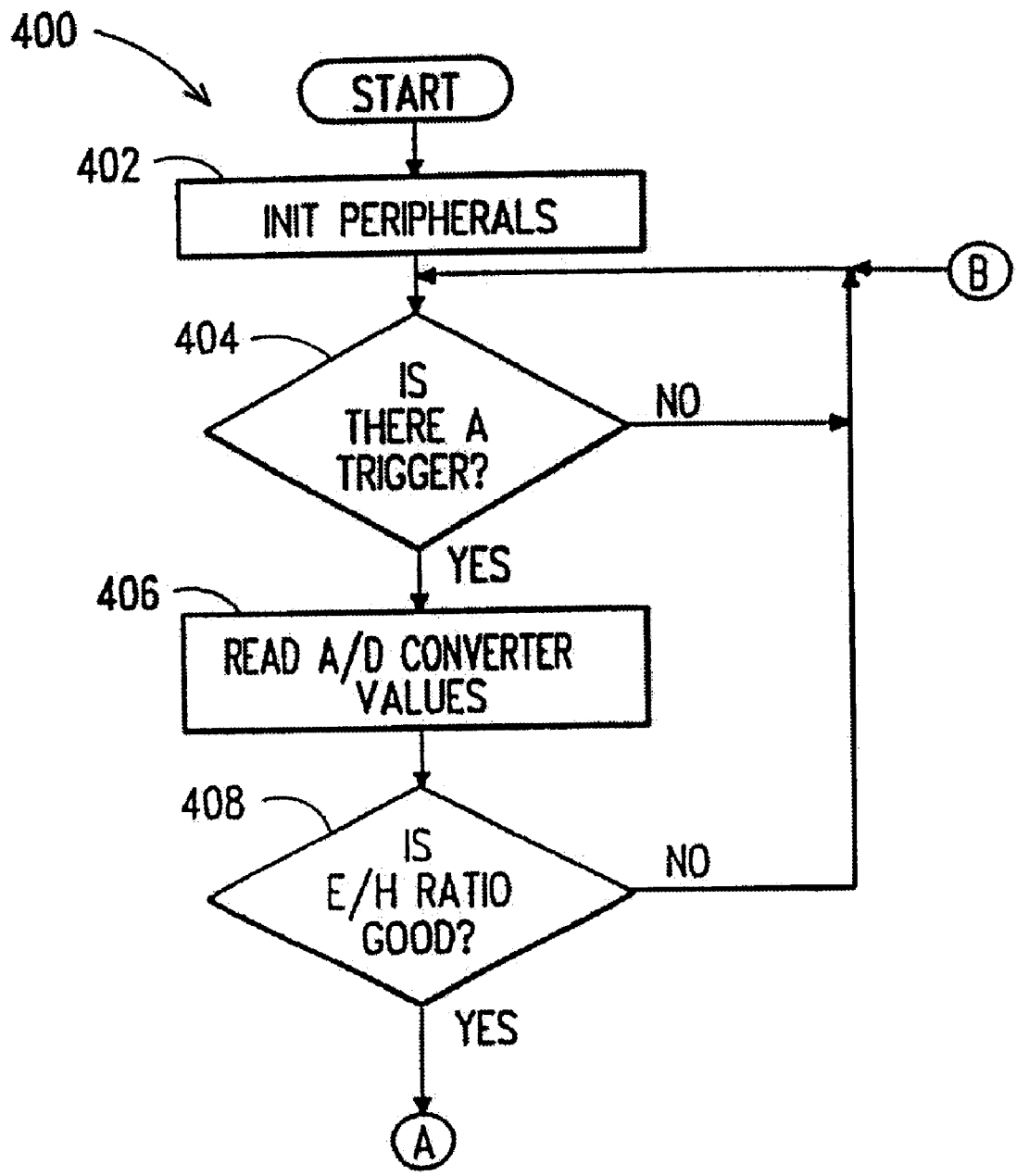
FIGS. 15A and 15B are flow diagrams illustrating process steps associated with a processor forming a part of the lightning detection system of FIG. 10.
Figure 15B:
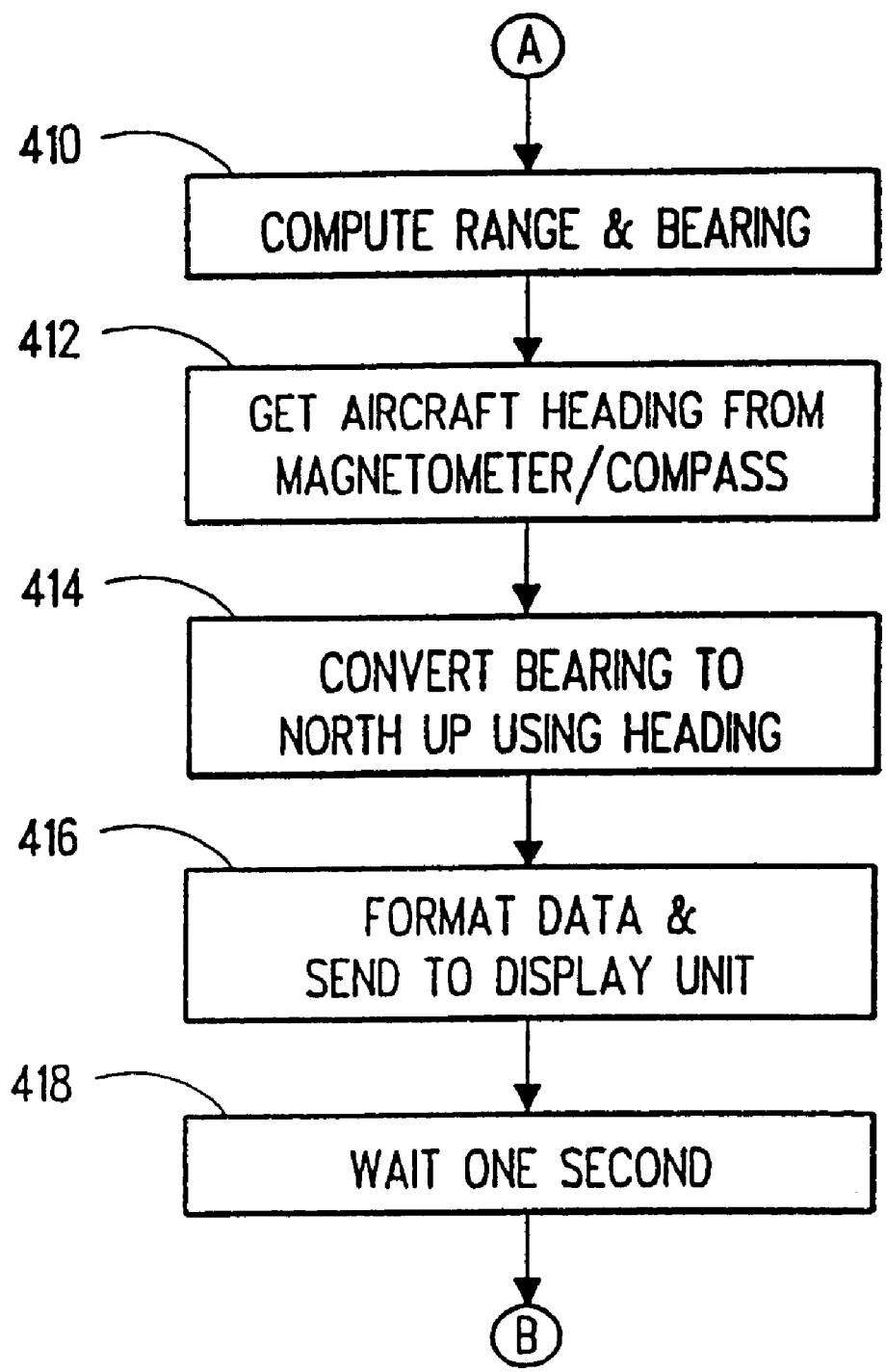

FIGS. 15A–B show a flow diagram 400 of one embodiment of the processing steps associated with event data sent to the processor 224 of FIG. 10. In step 402, the processor initializes peripheral equipment 402 and then waits at step 404 for a trigger. Upon receiving a trigger, the processor reads values from the A/D converter in step 406. In step 408, in order to screen out non-lightning events an E/H ratio computed from the A/D converter values is compared to a predetermined value. The E/H value for a lightning discharge is about 377 and an exemplary acceptable range of values is within the acceptable lightning discharge E/H ratio. After finding that the E/H ratio for the pulse is within acceptable limits, a range and bearing of the event is computed in step 410. The bearing is computed from the A/D channels as follows:

| Channel | Data |
|---|---|
| 1 | Positive E-field, E0 |
| 2 | Negative E-field, −E0 |
| 3 | Positive Reference, E1 |
| 4 | Negative Reference, −E1 |

-continued

| Channel | Data |
|---|---|
| 5 | Positive Quadrature, E2 |
| 6 | Negative Quadrature, −E2 |

The processor selects the larger of the absolute value of the positive and negative values of each channel while storing the sign of each value. The magnitude value of the Reference and Quadrature values is:

$$Vmag = SQRT(E1^2 + E2^2)$$

The Reference and Quadrature values are then normalized:

Vref = E1/Vmag

Vquad = E2/Vmag

A principal angle is then computed as follows:

$\phi = \arcsin(Vquad)$ for Vref > 0.707 or $\phi = \arcsin(Vref)$

The principal angle is the converted to the total angle using the sign of the original values as follows:

| Sign E0 | Sign E1 | Sign E2 | Total angle |
|---|---|---|---|
| + | + | + | θ = Φ |
| + | − | + | θ = 180 − Φ |
| + | − | − | θ = 180 + Φ |
| + | + | − | θ = 360 − Φ |
| − | − | − | θ = Φ |
| − | + | − | θ = 180 − Φ |
| − | + | + | θ = 180 + Φ |
| − | − | + | θ = 360 − Φ |

Thus the direction or bearing of the initial discharge is determined.

The range is determined from the amplitude of the pulse. Since the initial pulse has a known amplitude that falls off as a function of distance, the range can be directly determined as follows:

Range = (RangeFactor1/E0)

A default value for RangeFactor1 is 20.0 based on empirical data, such as from the circuit of FIG. 11. Other values of course can be used.

The E/H ratio is calculated as follows:

E/H = E0/Vmag

The electronic circuit gains have been adjusted so that E/H is approximately 1.0.

The E/H ratio for a lightning event is about 377, but circuit amplification gains can be adjusted so that in an exemplary implementation, the E/H ratio is about 1.

In step 412, the processor calculates a heading for an aircraft from a compass. The processor converts the bearing to north up using the heading in step 414. Bearing data is then formatted and sent to a display unit in step 416. The processor waits for one second until waiting for another trigger in step 418.

An altitude for a detected lightning discharge can be assigned after differentiating between an IC and CG discharge. As shown in FIG. 1, a default altitude of about 5 km can be assigned for a CG discharge, and about 9 km for a IC discharge. The altitudes can be further refined based upon the maturity and intensity of the thunderstorm based on lighting rates and rates of change.

Figure 16:
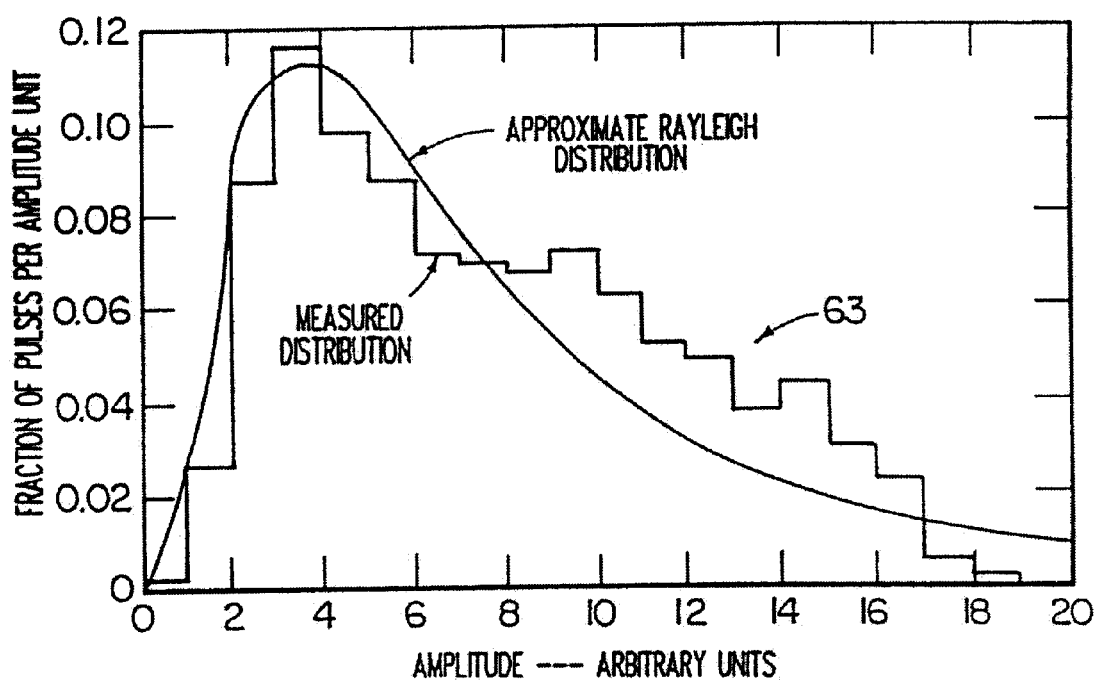
FIG. 16 is an exemplary distribution of pulse amplitudes corresponding to a lightning stroke.

As shown FIG. 16 in conjunction with FIGS. 4 and 5, a plot 63 of pulse amplitudes during a lightning stroke reveals a distribution approximating a Rayleigh distribution. In particular, in between pulses 58, corresponding to recoil streamers 56, during a flash 54 for example, a series of pulses are detected having durations of about a microsecond as is known in the art. Thousands of pulses are persistently radiated during a lightning event. The plot 63 of pulse amplitudes show that peak values are reached relatively rapidly followed by a more gradual decline in amplitude. It will be appreciated that pulses also occur after an initial pulse 62.

In a further embodiment, a lightning detection system having a single sensor detects a series of about microsecond long pulses corresponding to a lightning stroke to obtain a peak value from a distribution of pulse amplitudes which approximate a Rayleigh distribution. The peak amplitude value is used to determine a distance for the lightning event In an exemplary embodiment, about twenty pulses are used to determine a peak value or an average value, however, other distributions having other numbers of pulses are possible and contemplated. Thus, an initial pulse need not be detected. Return stroke pulses can be filtered out by rise time which typically are in the order of five microseconds. Alternatively, and providing a greater range, CG return strokes are detected to determine a peak value from a Rayleigh distribution of pulse amplitudes corresponding to CG return strokes. Thus, more accurate event locations are obtainable in comparison with single sensor systems utilizing an overall amplitude flash or ratios of amplitudes at different frequencies.

Figure 17:
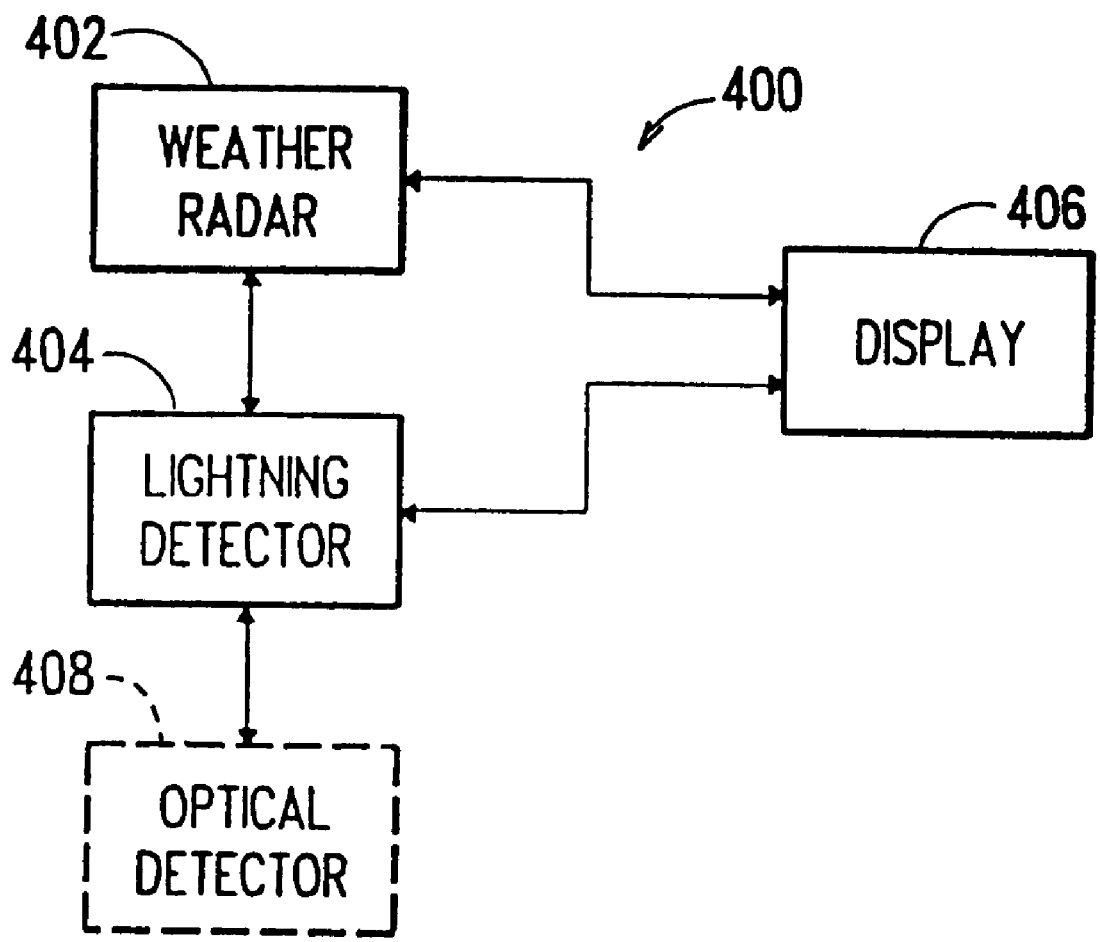
FIG. 17 is a block diagram of an alternative embodiment of a lightning detection system including a weather radar according to the present invention.

FIG. 17 shows an alternative embodiment of a lightning detection system including a non-weather marine radar and a lightning detector. Typical marine radars are sensitive to rainfall and provide a display of the detected weather conditions on a display. A single station lightning detector coupled to a weather radar adds lighting data to the display so areas of rainfall with lightning can be identified as thunderstorms. In addition, the lightning detector uses the radar rain data to increase lightning location accuracy.

In an exemplary embodiment, a lightning detection system 400 includes a marine radar 402 and a lightning detection unit 404 having a single sensor to provide respective weather and lightning information to a display 406 An exemplary marine radar is a ship radar made by the Marine division of Raytheon. In an illustrative embodiment, the single sensor first pulse ranging technique is used to obtain the distance to the lightning and simple crossed loops would provide direction to the first pulse.

A further embodiment of a lightning detection system includes an optical lightning detector 408 shown in phantom. Systems for providing optical lightning detection are disclosed in U.S. Pat. Nos. 5,057,820 and in 5,396,220, both to Markson et al., both of which are incorporated herein by reference. In an exemplary embodiment, the optical detector 408 is divided into eight 45° sectors. Detected lightning is placed in one of three range bins, 0–5 nautical miles (NM), 5–10 NM, and 10–30 NM base upon intensity of light detected from a lightning discharge.

The range of an initial RF pulse is determined by the lightning detection system from the amplitude of the pulse, typically having a duration of about one microsecond, and having a sharp rise. The range is determined from the amplitude of the detected pulse based on the fact that the signal intensity falls off with respect to distance as 1/range. The initial pulse, or pulses, measurements occur within the first 100 meters of an initial leader channel over a period of about 1 millisecond. By processing only an initial pulse, or pulses, system processing complexity and capacity is reduced in comparison with systems that compute the positions of many strokes and pulses in each flash. Pulse information is formatted for the display 406 and integrated with weather data from the weather radar 402 for viewing by a user.

These and other examples of the concept of the aforedescribed invention are intended by way of example and the actual scope of the invention is to be determined from the following claims

What is claimed is:

1. A lightning location detection system, comprising:
   a sensor system detecting radio-frequency (RF) energy radiated by lightning discharges, said sensor system comprising an electric-field antenna and a crossed loop antenna;
   a filter in electrical communication with said sensor system, said filter receiving an RF output signal from said sensor system, said filter blocking low-frequency components of said RF output signal and passing unblocked frequency components of said RF output signal; and
   a signal processor in communication with said filter determining the location of an initial lightning breakdown process responsive to the unblocked components of said RF output signal, the unblocked components corresponding to at least one of only a predetermined number of initial microsecond or shorter pulses corresponding to said RF energy radiated by an initial lightning discharge of an initial leader stroke of a lightning flash.

2. The lightning location detection system of claim 1 wherein said sensor system is disposed in an aircraft.

3. The lightning location detection system of claim 1 wherein said signal processor uses the amplitude of said unblocked components of said RF output signals corresponding to said at least one of only a predetermined number of initial microsecond or shorter pulses to determine the distance to the initial lightning breakdown process.

4. The lightning detection system of claim 3 wherein said signal processor determines the polarity of unblocked frequency components of said RF output signals corresponding to said at least one of only a predetermined number of microsecond or shorter initial pulses and uses the detected polarity to differentiate between intracloud initial lightning discharges and cloud to ground initial lightning discharges.

5. The lightning location detection system of claim 1 wherein said signal processor identifies lightning events by forming a ratio of an electric field strength to a magnetic field strength of said unblocked frequency components of said RF output signals.

6. The lightning location detection system of claim 5 wherein said signal processor identifies a lightning event if the ratio is about 377.

7. The lightning location detection system of claim 1 wherein said sensor system determines a rate of initial lightning breakdown processes and uses said rate of initial lightning breakdown processes to predict microbursts.

8. The lightning location detection system of claim 1 further comprising a display, wherein the location of the initial lightning breakdown process is displayed as a point on said display.

9. A method for determining the location of lightning comprising the steps of:
   (a) sensing radio-frequency (RF) energy emitted by initial lightning discharges of initial leader strokes of lightning flashes with a sensor system comprising an electric-field antenna and a crossed loop antenna;

(b) blocking low-frequency components of the sensed energy;

(c) passing unblocked frequency components of the sensed energy to a signal processor;

(d) detecting at least one of only a predetermined number of microsecond or shorter initial pulses in said unblocked frequency components produced by initial lightning discharges of initial leader strokes of lightning flashes; and (e) determining the location of the initial lightning discharges from the detected at least one of only a predetermined number of microsecond or shorter initial pulses.

10. The method of claim 9 wherein step (d) comprises determining the location of the initial lightning discharges from the amplitude of the detected at least one of only a predetermined number of microsecond or shorter initial pulses.

11. The method of claim 9, further comprising:

(f) providing a plurality of sensors systems, each comprising an electric-field antenna and a crossed loop antenna; and (g) determining the location of the initial lightning discharges from the time difference between each sensor system's detection of the at least one of only a predetermined number of microsecond or shorter initial pulses.

12. The method of claim 9 further comprising the steps of:

determining a rate of initial lightning discharges; and predicting the occurrence of microbursts using the determined rate of initial lightning discharges.

13. The method of claim 9 further comprising the step of:

differentiating between intracloud lightning discharges and cloud to ground lightning discharges using the polarity of the unblocked components of the sensed energy.

14. The method of claim 9 further comprising the step of;

identifying lightning events by forming a ratio of the electric field strength to the magnetic field strength of the unblocked components of the sensed energy.

15. The method of claim 9 further comprising the steps of:

forming a ratio of the electric field strength to the magnetic field strength of the unblocked components of the sensed energy; and identifying a lightning event if the ratio yields a quotient of about 377.

16. The method of claim 9 further comprising the step of:

displaying the determined location of the initial lightning discharges as a single point on a display.

* * * * *